(12) United States Patent  (10) Patent No.: US 9,397,296 B2
Yu  (45) Date of Patent: Jul. 19, 2016

(54) METHOD OF MANUFACTURING ORGANIC LIGHT EMITTING DISPLAY APPARATUS

(71) Applicant: Samsung Display Co., Ltd., Yongin, Gyeonggi-Do (KR)

(72) Inventor: Kyong Tae Yu, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 41 days.

(21) Appl. No.: 14/158,635

(22) Filed: Jan. 17, 2014

(65) Prior Publication Data

US 2014/0357003 A1  Dec. 4, 2014

(30) Foreign Application Priority Data

May 30, 2013  (KR) .................. 10-2013-0061827

(51) Int. Cl.
*H01L 21/00* (2006.01)
*H01L 51/00* (2006.01)

(52) U.S. Cl.
CPC ........... *H01L 51/0011* (2013.01); *H01L 51/001* (2013.01); *H01L 51/0012* (2013.01); *H01L 51/0013* (2013.01)

(58) Field of Classification Search
None
See application file for complete search history.

(56) References Cited

U.S. PATENT DOCUMENTS

| 4,512,848 | A | * | 4/1985 | Deckman et al. | ................ 216/43 |
| 5,328,854 | A | * | 7/1994 | Vakhshoori et al. | ........... 438/22 |
| 2003/0044517 | A1 | | 3/2003 | Nishikawa et al. | |
| 2011/0215329 | A1 | * | 9/2011 | Chung | ................. H01L 27/326 257/59 |
| 2012/0112370 | A1 | * | 5/2012 | Kobayashi | .................... 257/797 |
| 2012/0161600 | A1 | * | 6/2012 | Norris et al. | .................... 313/11 |
| 2013/0084666 | A1 | * | 4/2013 | Oshige | ........................... 438/35 |

FOREIGN PATENT DOCUMENTS

| JP | 2003-151768 | 5/2003 |
| KR | 10-2012-0046143 | 5/2012 |

* cited by examiner

*Primary Examiner* — Calvin Choi
(74) *Attorney, Agent, or Firm* — Innovation Counsel LLP

(57) ABSTRACT

A method of manufacturing an organic light emitting display apparatus is presented. The method includes providing a device substrate on which a first electrode and a pixel definition layer covering a portion of the first electrode are formed, forming a master substrate on which a transfer mask is patterned to mirror positions of the pixel definition layer, coupling the transfer mask to the pixel definition layer, forming an organic material layer on the exposed portion of the first electrode using the transfer mask as a protection layer, and removing the transfer mask. The transfer mask may replace a deposition metal mask.

18 Claims, 4 Drawing Sheets

METHOD OF MANUFACTURING ORGANIC LIGHT EMITTING DISPLAY APPARATUS

CROSS-REFERENCE TO RELATED APPLICATION

This patent application claims priority, under 35 U.S.C. §119, to Korean Patent Application No. 10-2013-0061827 filed on May 30, 2013, the contents of which are hereby incorporated by reference.

BACKGROUND

1. Field of Disclosure

The present disclosure relates to a method of manufacturing an organic light emitting display apparatus. More particularly, the present disclosure relates to a method of manufacturing an organic light emitting display apparatus using a new type of mask instead of a metal mask when performing an organic material deposition process.

2. Description of the Related Art

An organic light emitting display (OLED) displays information, e.g., image, text, etc., using light when holes provided from an anode electrode are combined with electrons provided from a cathode electrode in an organic light emitting layer disposed between the anode electrode and the cathode electrode.

When the organic light emitting display is manufactured, a hole injection layer, a hole transport layer, the organic light emitting layer, an electron transport layer, and an electron injection layer are formed by a thermal deposition process or a vacuum deposition process, which uses a metal mask.

The metal mask is not ideal for forming a fine pattern since the metal mask bends due to its own weight. In addition, the metal mask requires a separate frame to support its edge. Further, a separate fixing member, e.g., magnet, is required to fix the metal mask with respect to a target substrate.

SUMMARY

The present disclosure provides a method of manufacturing an organic light emitting display apparatus without using a metal mask.

Embodiments of the inventive concept provide a manufacturing method of an organic light emitting display including preparing a device substrate on which a first electrode and a pixel definition layer covering a portion of the first electrode are formed, forming a transfer mask on a master substrate, wherein the transfer mask is positioned to mirror the surfaces of the pixel definition layer, coupling the transfer mask to the pixel definition layer, forming an organic material layer on the first electrode using the transfer mask as a protection layer, and removing the transfer mask.

The method may also entail forming of the master substrate by forming a deposition layer on a transparent first substrate and patterning the deposition layer to form the transfer mask.

The coupling of the transfer mask to the pixel definition layer includes disposing the device substrate and the master substrate such that the transfer mask faces the pixel definition layer, and irradiating light onto the master substrate at an upper portion of the master substrate.

The transfer mask and the pixel definition layer are coupled to each other by electrostatic attraction between the transfer mask and the pixel definition layer.

The coupling of the transfer mask to the pixel definition layer further includes selectively removing the first substrate.

The removing of the transfer mask includes providing a removing substrate which includes a second substrate and an adhesive layer formed on the second substrate, attaching the adhesive layer to the transfer mask, and using the adhesive force between the adhesive layer and the transfer mask to separate the transfer mask from the pixel definition layer.

According to the above, the transfer mask includes a material other than metal. Thus, the transfer mask and the pixel definition layer are attached to each other by the electrostatic attraction therebetween and no separate fixing member is required to fix the transfer mask. In addition, since the transfer mask is directly transferred onto the device substrate, no separated frame is required.

BRIEF DESCRIPTION OF THE DRAWINGS

The above and other advantages of the present disclosure will become readily apparent by reference to the following detailed description when considered in conjunction with the accompanying drawings, wherein.

DETAILED DESCRIPTION

Figure 1:
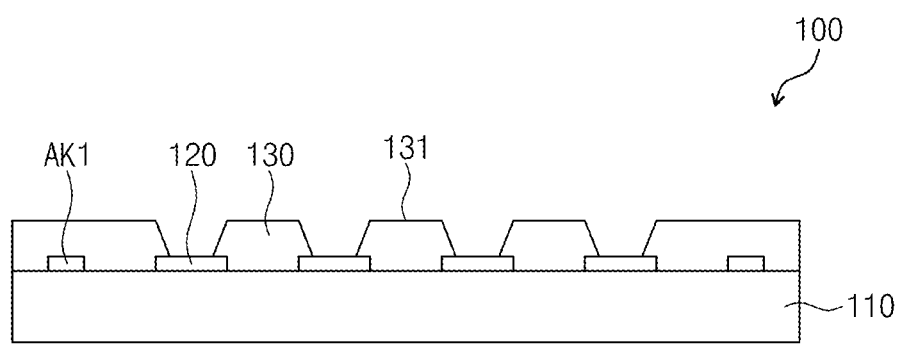
FIG. 1 is a cross-sectional view showing a device substrate.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

In the present exemplary embodiment, a deposition mask employed in a deposition device for a flat panel display device will be described as an example of a transfer mask, but it should not be limited thereto or thereby. A method of manufacturing the transfer mask according to the present disclosure may be adopted in various mask manufacturing processes, such as a deposition mask employed in a deposition process of a semiconductor device, a photo-mask employed in a photolithography process of a flat panel display or a semiconductor device, etc.

For instance, the transfer mask may be a deposition mask used for a deposition process of positive and negative electrodes and an organic light emitting layer of an organic light emitting display apparatus, and the transfer mask may be a deposition mask used for a deposition process to form a pattern on a semiconductor wafer by a thermal deposition/e-beam deposition method.

In addition, the transfer mask may be a photo-mask used for an exposure process to transfer patterns among manufacturing processes of a thin film transistor or a pixel electrode of a liquid crystal display device, or the transfer mask may be a photo-mask used for an exposure process to transfer patterns among manufacturing processes of a semiconductor device.

Hereinafter, a method of manufacturing an organic light emitting display apparatus will be described with reference to FIGS. 1 to 8.

FIG. 1 is a cross-sectional view showing a device substrate.

Referring to FIG. 1, a device substrate 100 that includes a lower substrate 110, a first electrode 120 formed on the lower substrate 110, a pixel definition layer 130 exposing a portion of the first electrode 120, and a first alignment key AK1 is provided. The first electrode 120 and the pixel definition layer 130 are formed through a photolithography process.

The lower substrate 110 may be a transparent substrate, such as a glass substrate, a quartz substrate, a plastic substrate, etc. Although not shown in figures, the lower substrate 110 has a TFT structure or an oxide semiconductor structure, may include a switching device having a source electrode or a drain electrode, and have an insulating structure, etc.

The first electrode 120 is formed by various processes, such as a sputtering process, an atomic layer deposition process, a vacuum deposition process, a printing process, etc., using a transparent conductive material such as indium tin oxide (ITO), zinc tin oxide (ZTO), indium zinc oxide (IZO), zinc oxide (ZnOx), tin oxide (SnO2), etc. The first electrode 120 is electrically connected to the switching device through the source electrode or the drain electrode.

A first deposition layer is formed on the first electrode 120 and partially removed by selective exposure and development to form the pixel definition layer 130. The first deposition layer includes a photosensitive material such as acrylic resin, polyimide, benzocyclobutene (BCB), etc. However, materials listed herein are not meant to be exhaustive and the scope of the invention should not be limited thereto. The first deposition layer may be formed of a non-photosensitive organic material layer or a non-photosensitive inorganic material layer according to another exemplary embodiment.

The first alignment key AK1 is formed in an area that is closer to an edge of the lower substrate 110 than to the center of the substrate. The first alignment key AK1 may be formed using the same material as that of the pixel definition layer 130. In addition, the first alignment key AK1 may be formed by the same process as the pixel definition layer 130. The first alignment key AK1 is used for aligning the device substrate 100 with a master substrate, as will be described later.

Figure 2:
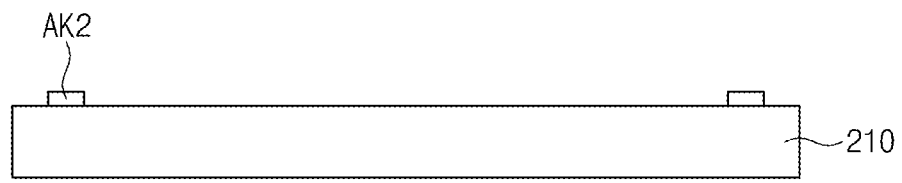
FIGS. 2 to 4 are cross-sectional views showing a method of forming a master substrate.
Figure 3:
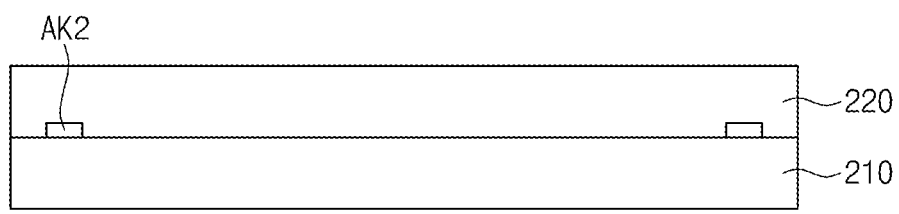
Figure 4:
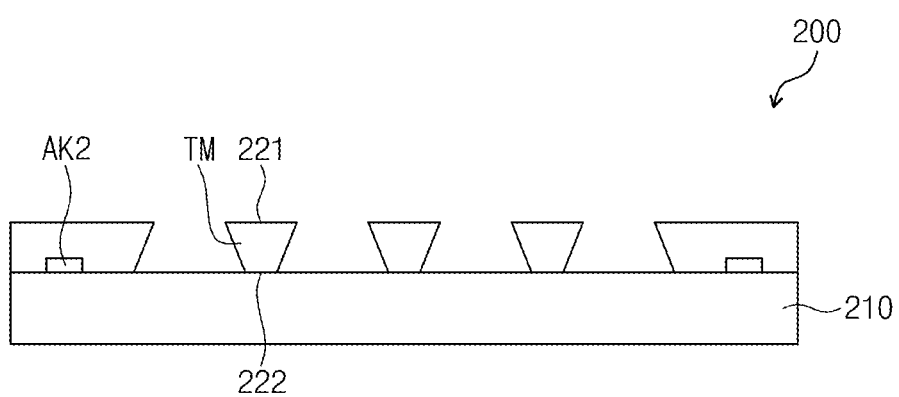

FIGS. 2 to 4 are cross-sectional views showing a method of forming the master substrate 200.

Referring to FIG. 2, a first substrate 210 is provided. The first substrate 210 has a size equal to or greater than that of the device substrate 100 to cover the device substrate 100 (shown in FIG. 1) in a plan view. The first substrate 210 is a transparent substrate, such as a glass substrate, a quartz substrate, a plastic substrate, etc.

A second alignment key AK2 is formed on the first substrate 210. The second alignment key AK2 is formed by a photolithography process. The second alignment key AK2 has a shape that is similar to that of the first alignment key AK1 shown in FIG. 1.

Referring to FIG. 3, a second deposition layer 220 is formed on the first substrate 210. The second deposition layer 220 is formed of a photosensitive material, such as, acrylic resin, polyimide, benzocyclobutene (BCB), etc., but the inventive concept should not be limited thereto. That is, the second deposition layer 220 may be formed of a non-photosensitive organic material layer or a non-photosensitive inorganic material layer according to another exemplary embodiment. The second deposition layer 220 has a thickness of about 0.3 µm to about 100 µm.

Referring to FIG. 4, the second deposition layer 220 is partially etched to form a transfer mask TM. The transfer mask TM is formed by patterning the second deposition layer 220 in a way that mirrors the surfaces of the pixel definition layer 130 shown in FIG. 1. That is, the device substrate 100 may be aligned with the first substrate 210 having the transfer mask TM formed thereon by positioning the first alignment key AK1 in a predetermined way with respect to the second alignment key AK2. When the first and second alignment keys AK1, AK2 are positioned in the predetermined way, the transfer mask TM and the pixel definition layer 130 are overlapped with each other. In one embodiment, the first and second alignment keys AK1, AK2 may be aligned so that one alignment key is on top of the other.

The transfer mask TM includes a first surface 221 and a second surface 222. The first surface 221 is more spaced apart from the first substrate 210 than the second surface 222 by a thickness of the transfer mask TM, and the second surface 222 faces the first surface 221. The first surface 221 of the transfer mask TM has substantially the same shape and size as an upper surface of a corresponding pixel definition layer 130 (shown in FIG. 1). The first surface 221 has a size greater than that of the second surface 222. That is, the transfer mask TM has a trapezoid shape when viewed in a cross-sectional view, as shown in FIG. 4. The transfer mask TM may be formed by a wet-etching process.

Thus, the master substrate 200 is manufactured.

Figure 5:
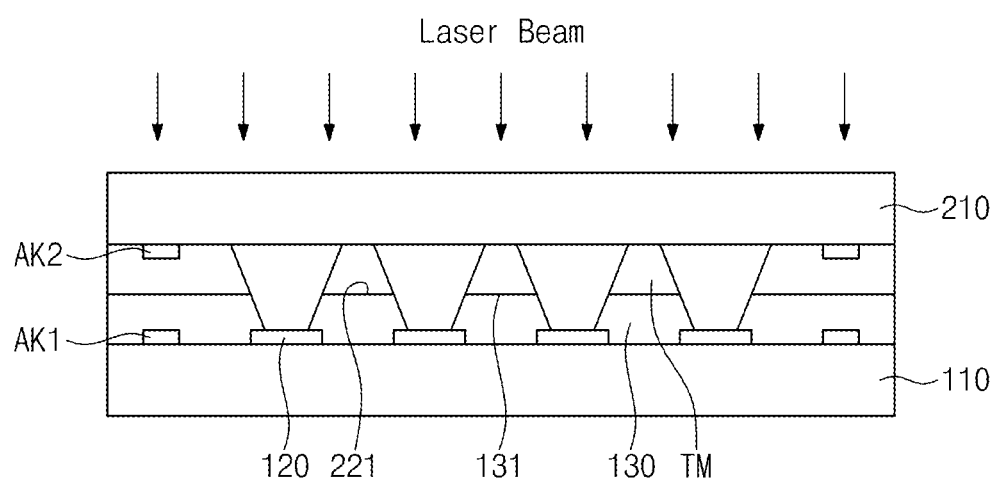
FIG. 5 is a cross-sectional view showing a transferring process of a transfer mask on the device substrate.

FIG. 5 is a cross-sectional view showing a transferring process of the transfer mask on the device substrate.

Referring to FIG. 5, the master substrate 200 manufactured by the manufacturing processes described with reference to FIGS. 2 to 4 is disposed or laminated on an upper portion of the device substrate 100 such that the transfer mask TM substantially faces the pixel definition layer 130 of the device substrate 100. In some embodiments, the transfer mask TM contacts the pixel definition layer 130. The first and second alignment keys AK1 and AK2 being aligned with each other results in the first surface 221 of the transfer mask TM being aligned with an upper surface 131 of the pixel definition layer 130. The first surface 221 of the transfer mask TM being aligned with the upper surface 131 of the pixel definition layer 130 results in the surfaces of the two contact surfaces being matched.

Then, a laser beam is irradiated on an upper portion of the master substrate 200 to transfer the transfer mask TM onto the pixel definition layer 130 (see FIG. 5). When the laser beam reaches the transfer mask TM after passing through the first substrate 210, the transfer mask TM is separated from the first substrate 210. The transfer mask TM and the pixel definition layer 130 may be attached to each other by electrostatic attraction. After that, the first substrate 210 is removed.

Figure 6:
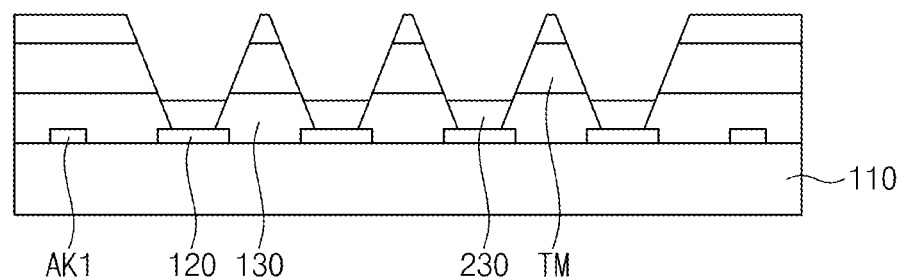
FIG. 6 is a cross-sectional view showing a deposition process of an organic layer on the device substrate on which the transfer mask is transferred.

FIG. 6 is a cross-sectional view showing a deposition process of an organic layer on the device substrate on which the transfer mask is transferred.

Referring to FIG. 6, an organic material layer 230 is deposited on the exposed portion of the first electrode 120 between the transfer masks TM. The organic material layer 230 is formed by a vacuum deposition process or a thermal deposition process. When the organic material is deposited on the transfer mask TM, the organic material layer 230 is formed on the portion of the first electrode 120 between the transfer masks TM.

The organic material layer 230 may be formed in plural layers by performing multiple deposition processes. Although not shown in the figures, the organic material layer 230 is formed into at least two of a hole injection layer, a hole transport layer, an organic light emitting layer, an electron transport layer, and an electron injection layer. If the organic material layer 230 includes the hole injection layer and the hole transport layer, the transfer mask TM serves as a deposition mask to form both the hole injection layer and the hole transport layer. In general, one deposition material is deposited using one deposition mask in each deposition chamber during a deposition process. That is, the hole injection layer would be deposited on a device substrate using one deposition mask in one chamber. Then, the device substrate moves to another chamber, and the hole transport layer is deposited on the device substrate using another deposition mask in another chamber. In contrast, the transfer mask TM according to the present exemplary embodiment serves as the deposition mask in different stages of the deposition process. The organic material is deposited on the device substrate 100 that has the transfer mask TM thereon while the device substrate 100 moves between different chambers. Therefore, no additional deposition mask is required in each deposition process.

Figure 7:
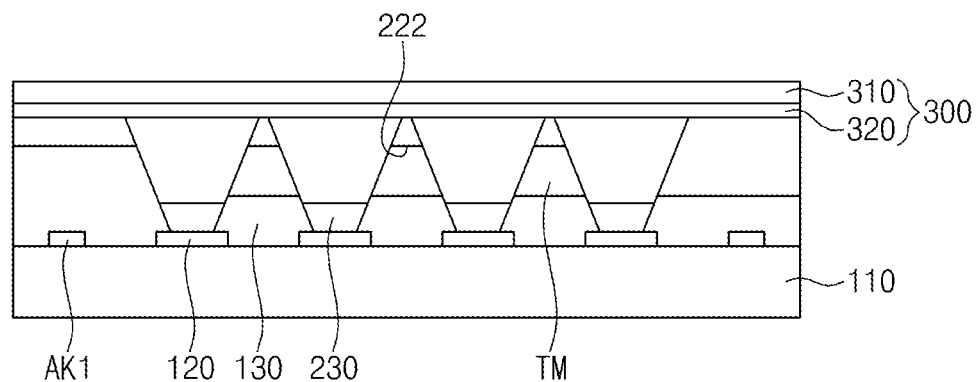
FIGS. 7 and 8 are cross-sectional views showing a removing process of the transfer mask from the device substrate.
Figure 8:
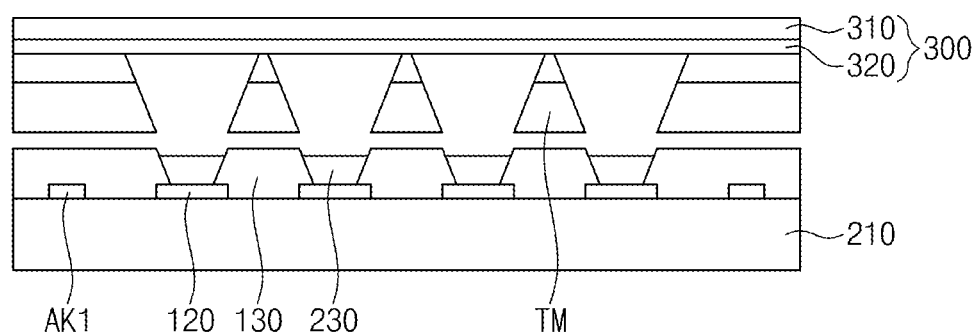

FIGS. 7 and 8 are cross-sectional views showing a removing process of the transfer mask from the device substrate.

Referring to FIG. 7, a removing substrate 300 is provided. The removing substrate 300 includes a second substrate 310 and an adhesive layer 320 formed on the second substrate 310. The adhesive layer 320 is formed of a material having a high adhesive strength to the organic material. For example, the adhesive layer may include at least optical clear adhesive (OCA) and optical clear resin (OCR). The adhesion between the adhesive layer and the organic material is stronger than the electrostatic attraction force between the transfer mask TM and the pixel definition layer 130. Then, the removing substrate 300 is disposed on the upper portion of the device substrate 100 such that the adhesive layer 320 faces the transfer mask TM. The removing substrate 300 is coupled to the device substrate 100. Thus, the organic material deposited on the second surface 222 of the transfer mask TM is attached to the adhesive layer 320.

Referring to FIG. 8, the removing substrate 300 having the transfer mask TM attached thereto is removed. Since the electrostatic attraction between the transfer mask TM and the pixel definition layer is weaker than the adhesive force between the transfer mask TM and the adhesive layer 320, the transfer mask TM stays with the removing substrate 300 and separates from the pixel definition layer 130.

Then, although not shown in the figures, a second electrode (not shown) is formed on the organic material layer 230, and a sealing substrate (not shown) is formed on the device substrate 100. The sealing substrate seals the organic material layer 230 and the second substrate to protect them from humidity and external impacts. Thus, the organic light emitting display apparatus according to the present disclosure is manufactured.

In a conventional method, a metal mask is used to form the organic material layer. In this case, a separate magnet is required to attach the mask to the device substrate. However, the transfer mask TM according to the present disclosure is formed of a material such as polyimide rather than metal, and thus the mask may be attached to the pixel definition layer by the electrostatic attraction between them, making the magnet unnecessary.

In addition, the metal mask requires a frame that supports its edge to prevent the metal mask from being bent. However, the transfer mask according to the present disclosure is directly transferred to the device substrate, and thus no additional frame is required.

Although the exemplary embodiments of the present disclosure have been described, it is understood that the present disclosure should not be limited to these exemplary embodiments but various changes and modifications can be made by one ordinary skilled in the art within the spirit and scope of the present disclosure.

What is claimed is:

1. A method of manufacturing an organic light emitting display apparatus, comprising:

preparing a device substrate on which a plurality of first electrodes and a pixel definition layer are formed, wherein the pixel definition layer is disposed to extend a distance between neighboring first electrodes and cover a portion of each of the neighboring first electrodes;

forming a master substrate including a transfer mask on a first substrate which is transparent, wherein the transfer mask overlaps with the pixel definition layer, and the transfer mask has a first surface spaced apart from the first substrate by at least a thickness of the transfer mask and a second surface facing the first surface;

placing the transfer mask on a top surface of the pixel definition layer so that the transfer mask is separated from the first substrate, wherein the first surface has a shape and a size that substantially matches those of the top surface of the pixel definition layer;

forming an organic material layer on each of the first electrodes using the transfer mask as a protection layer; and
removing the transfer mask.

2. The method of claim 1, wherein forming the master substrate comprises:
forming a deposition layer on the first substrate; and
patterning the deposition layer to form the transfer mask.

3. The method of claim 2, wherein the deposition layer comprises one of acrylic resin, polyimide, benzocyclobutene (BCB), a non-photosensitive organic material layer, and a non-photosensitive inorganic material layer.

4. The method of claim 2, wherein the first surface is larger than the second surface.

5. The method of claim 4, wherein the transfer mask has a trapezoid shape.

6. The method of claim 2, wherein the placing the transfer mask on the top surface of the pixel definition layer comprises:
disposing the device substrate and the master substrate such that the transfer mask faces the pixel definition layer; and
irradiating light onto the master substrate at an upper portion of the master substrate.

7. The method of claim 6, wherein the transfer mask and the pixel definition layer are coupled to each other by electrostatic attraction between the transfer mask and the pixel definition layer.

8. The method of claim 6, wherein the placing the transfer mask on the top surface of the pixel definition layer further comprises selectively removing the first substrate.

9. The method of claim 6, wherein the device substrate further comprises a first alignment key disposed at an edge thereof, and the forming of the master substrate further comprises forming a second alignment key at a predefined position with respect to the first alignment key on the first substrate.

10. The method of claim 9, wherein the disposing of the device substrate and the master substrate such that the transfer mask faces the pixel definition layer comprises aligning the first alignment key with the second alignment key.

11. The method of claim 1, wherein forming the organic material layer comprises forming a plurality of layers.

12. The method of claim 1, wherein the removing of the transfer mask comprises:
providing a removing substrate which includes a second substrate and an adhesive layer formed on the second substrate;
attaching the adhesive layer to the transfer mask; and
using the adhesive force between the adhesive layer and the transfer mask to separate the transfer mask from the pixel definition layer.

13. The method of claim 1, wherein the transfer mask has a thickness of about 0.3 µm to about 100 µm.

14. A method of manufacturing an organic light emitting display apparatus, comprising:
providing a substrate;
forming a plurality of first electrodes on the substrate;
forming pixel definition layers, each of the pixel definition layers extending a distance between neighboring first electrodes, wherein each of the pixel definition layers covers a portion of each of the neighboring first electrodes;
covering the pixel definition layers with transfer masks made of a second material and having a trapezoidal cross-section, wherein the second material attracts the first material by electrostatic force, wherein the transfer masks expose an area between the pixel definition layers; and
depositing layers on the substrate with the transfer masks on the pixel definition layers.

15. The method of claim 14, wherein each of the transfer mask includes a pattern that overlaps with each of the pixel definition layers, such that a surface of each of the transfer masks matches a surface of each of the pixel definition layers.

16. The method of claim 14 further comprising removing the transfer masks using a force greater than the electrostatic force between the pixel definition layers and the metal masks.

17. The method of claim 1, wherein each of the pixel definition layers has tapered sidewalls that are wider closer to the device substrate, and the sidewalls have a slope that matches the sidewalls of each of the transfer masks.

18. The method of claim 1, wherein the pixel definition layer is provided in plural, and the transfer mask is not disposed between neighboring pixel definition layers.

* * * * *